United States Patent
Cheng et al.

(10) Patent No.: US 12,089,369 B2
(45) Date of Patent: Sep. 10, 2024

(54) SEPARATE IMMERSION COOLING DEVICE AND SEPARATE IMMERSION COOLING SYSTEM HAVING THE SAME

(71) Applicant: Wiwynn Corporation, New Taipei (TW)

(72) Inventors: Yi Cheng, New Taipei (TW); Tsung-Han Li, New Taipei (TW); Chin-Han Chan, New Taipei (TW); Ting-Yu Pai, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 224 days.

(21) Appl. No.: 17/846,254

(22) Filed: Jun. 22, 2022

(65) Prior Publication Data

US 2023/0320033 A1 Oct. 5, 2023

(30) Foreign Application Priority Data

Mar. 22, 2022 (TW) .................................. 111110695

(51) Int. Cl.
*H05K 7/20* (2006.01)

(52) U.S. Cl.
CPC ......... *H05K 7/203* (2013.01); *H05K 7/20136* (2013.01); *H05K 7/20318* (2013.01); *H05K 7/20327* (2013.01); *H05K 7/20818* (2013.01)

(58) Field of Classification Search
CPC .............. H05K 7/203; H05K 7/20136; H05K 7/20318; H05K 7/20327; H05K 7/20818; H05K 7/208; G06F 1/20; G06F 1/206; F25B 39/04; F28D 15/02
See application file for complete search history.

(56) References Cited

U.S. PATENT DOCUMENTS

| | | | |
|---|---|---|---|
| 10,130,013 B1* | 11/2018 | Iyengar | H05K 7/20309 |
| 2011/0069453 A1* | 3/2011 | Campbell | H05K 7/203 361/700 |
| 2014/0218861 A1* | 8/2014 | Shelnutt | H05K 7/20818 361/679.53 |
| 2021/0153392 A1* | 5/2021 | Gao | H05K 7/20818 |
| 2021/0219454 A1 | 7/2021 | Cheng et al. | |
| 2023/0046291 A1* | 2/2023 | Wang | H05K 7/20327 |
| 2023/0057498 A1* | 2/2023 | Gao | H05K 7/20318 |

(Continued)

FOREIGN PATENT DOCUMENTS

| | | |
|---|---|---|
| CN | 103298312 A | 9/2013 |
| TW | 201344055 A | 11/2013 |
| TW | 767546 B | 6/2022 |

OTHER PUBLICATIONS

Examination report dated Apr. 26, 2023, listed in related Taiwan patent application No. 111110695.

*Primary Examiner* — Stephen S Sul
*Assistant Examiner* — Jeffrey Francis Stoll
(74) *Attorney, Agent, or Firm* — McClure, Qualey & Rodack, LLP (57) ABSTRACT

A separate immersion cooling system includes a separate immersion cooling device. The separate immersion cooling device includes a condensing device, a plurality of cooling tanks, a plurality of outflow pipes and a plurality of return pipes. The separate immersion cooling device is adapted to cooling a heat-generating device immersed in the cooling tank.

19 Claims, 9 Drawing Sheets

(56) References Cited

U.S. PATENT DOCUMENTS

| | | | |
|---|---|---|---|
| 2023/0189486 A1* | 6/2023 | Oseen-Senda | H05K 7/20736 361/679.47 |
| 2023/0232584 A1* | 7/2023 | Manousakis | H05K 7/20827 361/700 |
| 2023/0254997 A1* | 8/2023 | Shaw | H05K 7/203 361/679.47 |

* cited by examiner

SEPARATE IMMERSION COOLING DEVICE AND SEPARATE IMMERSION COOLING SYSTEM HAVING THE SAME

CROSS-REFERENCE TO RELATED APPLICATION

This non-provisional application claims priority under 35 U.S.C. § 119(a) to Patent Application No. 111110695 filed in Taiwan, R.O.C. on Mar. 22, 2022, the entire contents of which are hereby incorporated by reference.

BACKGROUND

Technical Field

A cooling device and a cooling system are provided, and in particular, to an immersion cooling device and a cooling system.

Related Art

An existing immersion cooling device is usually provided with one or more coolers inside a cooling tank. However, due to a requirement of disassembling a heat-generating device inside the cooling tank, the cooler cannot be disposed at a position that blocks the disassembly of the heat-generating device, and thus the cooler is disposed in parallel with the heat-generating device. In this way, the immersion cooling device occupies a large space, and utilization of an inner space of the cooling tank is limited.

In addition, restricted by the condensing capacity of a single cooler, each of cooling tanks includes a plurality of coolers, which not only consumes energy in operation, but also limits the efficiency of condensation.

SUMMARY

This disclosure provides a separate immersion cooling device. According to some embodiments, the separate immersion cooling device includes a condensing device, a plurality of cooling tanks, and a pipeline assembly. The condensing device includes a condenser, located inside the condensing device. The cooling tanks are separably connected to the condensing device. Each cooling tank includes an outflow port and a return port, and the outflow port is located higher than the return port. The pipeline assembly separately communicates the outflow ports to the condensing device, and separately communicates the return ports to the condensing device.

According to some embodiments, the condensing device includes a case body, a plurality of condensation inlets, a plurality of condensation outlets, and a partition plate. The case body is provided with an accommodating space. The partition plate is located between the condensation inlets and the condensation outlets to partition the accommodating space into a vapor space and a condensing space. The condensation inlets communicate with the vapor space, and the condensation outlets communicate with the condensing space. The vapor space communicates with the condensing space, and the condenser is located in the condensing space.

According to some embodiments, the pipeline assembly includes a plurality of outflow pipes and a plurality of return pipes. The outflow pipes separately communicate the outflow ports to the condensation inlets. The return pipes separately communicate the return ports to the condensation outlets.

According to some embodiments, each cooling tank of the separate immersion cooling device is provided with a liquid adjusting hole, the cooling tanks communicate with each other by the liquid adjusting holes, and a position of each liquid adjusting hole in the corresponding cooling tank corresponds to a position of the return port of the cooling tank.

According to some embodiments, the pipeline assembly of the separate immersion cooling device includes a plurality of liquid adjusting pipes. A quantity of the liquid adjusting pipes is a quantity of the cooling tanks minus one, and each of the liquid adjusting pipes communicates with two of the cooling tanks.

According to some embodiments, each cooling tank of the separate immersion cooling device further includes a cover and a sensor. The sensor is located in the cover, where the sensor senses an action of the cover to generate a starting signal.

According to some embodiments, the condensing device further includes a fan, located at a communication portion of a vapor space and a condensing space, and the fan, when receiving one of the starting signals, pumps fluid in the vapor space toward the condensing space.

According to some embodiments, the partition plate of the separate immersion cooling device includes a connecting edge and an unconnected edge. The unconnected edge is located at a communication portion of the vapor space and the condensing space, and the connecting edge is connected to the case body and is located between the condensation inlet and the condensation outlet.

This disclosure further provides a separate immersion cooling device. According to some embodiments, the separate immersion cooling device includes a condensing device, a plurality of cooling tanks, and a pipeline assembly. The condensing device includes a condenser, located inside the condensing device. The cooling tanks are separably connected to the condensing device. Each of the cooling tanks includes an outflow port and a liquid adjusting hole. One of the cooling tanks includes a return port, and the outflow port is located higher than the return port. The pipeline assembly separately communicates the outflow ports to the condensing device, communicates the return ports to the condensing device, and further communicates with the liquid adjusting holes.

According to some embodiments, the pipeline assembly includes a plurality of outflow pipes, a return pipe, and a position adjusting pipe. The outflow pipes separately communicate the outflow ports to a condensation inlet. The return pipe communicates with a condensation outlet and the return port. The position adjusting pipe communicates with the liquid adjusting holes.

This disclosure further provides a separate immersion cooling system. According to some embodiments, the separate immersion cooling system includes a plurality of servers, a condensing device, a plurality of cooling tanks, and a pipeline assembly.

The condensing device includes a case body, a plurality of condensation inlets, a plurality of condensation outlets, a partition plate, and a condenser. The case body is provided with an accommodating space. The partition plate is located between the condensation inlets and the condensation outlets to partition the accommodating space into a vapor space and a condensing space. The condensation inlets communicate with the vapor space, and the condensation outlets communicate with the condensing space. The vapor space communicates with the condensing space, and the condenser is located in the condensing space.

The cooling tanks are separably connected to the condensing device, and each of the cooling tanks is configured to accommodate some of the servers. A distance between a wall surface of each cooling tank and a housing of a corresponding server is in a range of 1.5-2.0 mm. Each cooling tank includes an outflow port and a return port, and the outflow port is located higher than the return port. The pipeline assembly includes a plurality of outflow pipes and a plurality of return pipes. The outflow pipes separately communicate the outflow ports to the condensation inlets. The return pipes separately communicate the return ports to the condensation outlets.

According to some embodiments, each cooling tank of the separate immersion cooling system is provided with a liquid adjusting hole, the cooling tanks communicate with each other by the liquid adjusting holes, and a position of each liquid adjusting hole in the corresponding cooling tank corresponds to a position of the return port of the cooling tank.

According to some embodiments, the pipeline assembly of the separate immersion cooling system includes a plurality of liquid adjusting pipes. A quantity of the liquid adjusting pipes is a quantity of the cooling tanks minus one, and each of the liquid adjusting pipes communicates with two of the cooling tanks.

According to some embodiments, each cooling tank of the separate immersion cooling system further includes a cover and a sensor. The sensor is located in the cover, where the sensor senses an action of the cover to generate a starting signal.

According to some embodiments, the condensing device of the separate immersion cooling system further includes a fan, located at a communication portion of a vapor space and a condensing space, and the fan, when receiving one of the starting signals, pumps fluid in the vapor space toward the condensing space.

According to some embodiments, the partition plate of the separate immersion cooling system includes a plurality of connecting edges and an unconnected edge. The unconnected edge is located at a communication portion of the vapor space and the condensing space. The connecting edges are connected to the case body, and one of the connecting edges is located between the condensation inlets and the condensation outlets.

This disclosure further provides a separate immersion cooling system. According to some embodiments, the separate immersion cooling system includes a plurality of servers, a condensing device, a plurality of cooling tanks, and a pipeline assembly.

The condensing device includes a case body, a plurality of condensation inlets, a condensation outlet, a partition plate, and a condenser. The case body is provided with an accommodating space. The partition plate is located between the condensation inlets and the condensation outlet to partition the accommodating space into a vapor space and a condensing space. The condensation inlets communicate with the vapor space, and the condensation outlet communicates with the condensing space. The vapor space communicates with the condensing space, and the condenser is located in the condensing space.

The cooling tanks are separably connected to the condensing device. Each of the cooling tanks is configured to accommodate some of the servers. A distance between a wall surface of each cooling tank and a housing of a corresponding server is in a range of 1.5-2.0 mm. Each cooling tank includes an outflow port and a liquid adjusting hole, and one of the cooling tanks includes a return port. The pipeline assembly includes a plurality of outflow pipes, a return pipe, and a position adjusting pipe. The outflow pipes separately communicate the outflow ports to the condensation inlets; the return pipe communicates with the condensation outlet and the return port; and the position adjusting pipe communicates with the liquid adjusting hole.

According to some embodiments, because the condensing device of the separate immersion cooling device is disposed outside the cooling tank, it is unnecessary to reserve a space for configuring the condensing device in the cooling tank. Therefore, an inner space of the cooling tank can be effectively utilized, and a plurality of heat-generating devices can be placed in a single cooling tank. According to some embodiments, the condenser in the condensing device is not limited to the inner space of the cooling tank, and a user can select a condenser with a large size and high condensing power to enhance condensing capacity. According to some embodiments, the plurality of cooling tanks of the separate immersion cooling device have a plurality of flexible combinations, which are not limited to the type and size of the condensing device, so as to save manufacturing costs. According to some embodiments, a manner of configuring the condensing device outside replaces the existing manner of configuring a plurality of condensing devices (or condensers) inside the cooling tank, which can save manufacturing costs.

According to some embodiments, the separate immersion cooling system includes a separate immersion cooling device, adapted to cooling a plurality of servers. Because the condensing device is disposed outside the cooling tank, it is unnecessary to reserve a space for configuring the condensing device in the cooling tank. Therefore, an inner space of the cooling tank can be effectively utilized, and a plurality of servers can be placed in a single cooling tank. According to some embodiments, the condenser in the condensing device is not limited to the inner space of the cooling tank, and a user can select a condenser with a large size and high condensing power according to the power and quantity of the servers. According to some embodiments, the plurality of cooling tanks have a plurality of flexible combinations, which are not limited to the type and size of the condensing device. Therefore, the user can plan the cooling tanks to be used according to the size and quantity of servers, which can save manufacturing costs. In addition, according to some embodiments, a manner of configuring the condensing device of the separate immersion cooling system outside the cooling tank replaces the existing manner of configuring a plurality of condensing devices (or condensers) inside the cooling tank, which can save manufacturing costs.

DETAILED DESCRIPTION

Figure 1:
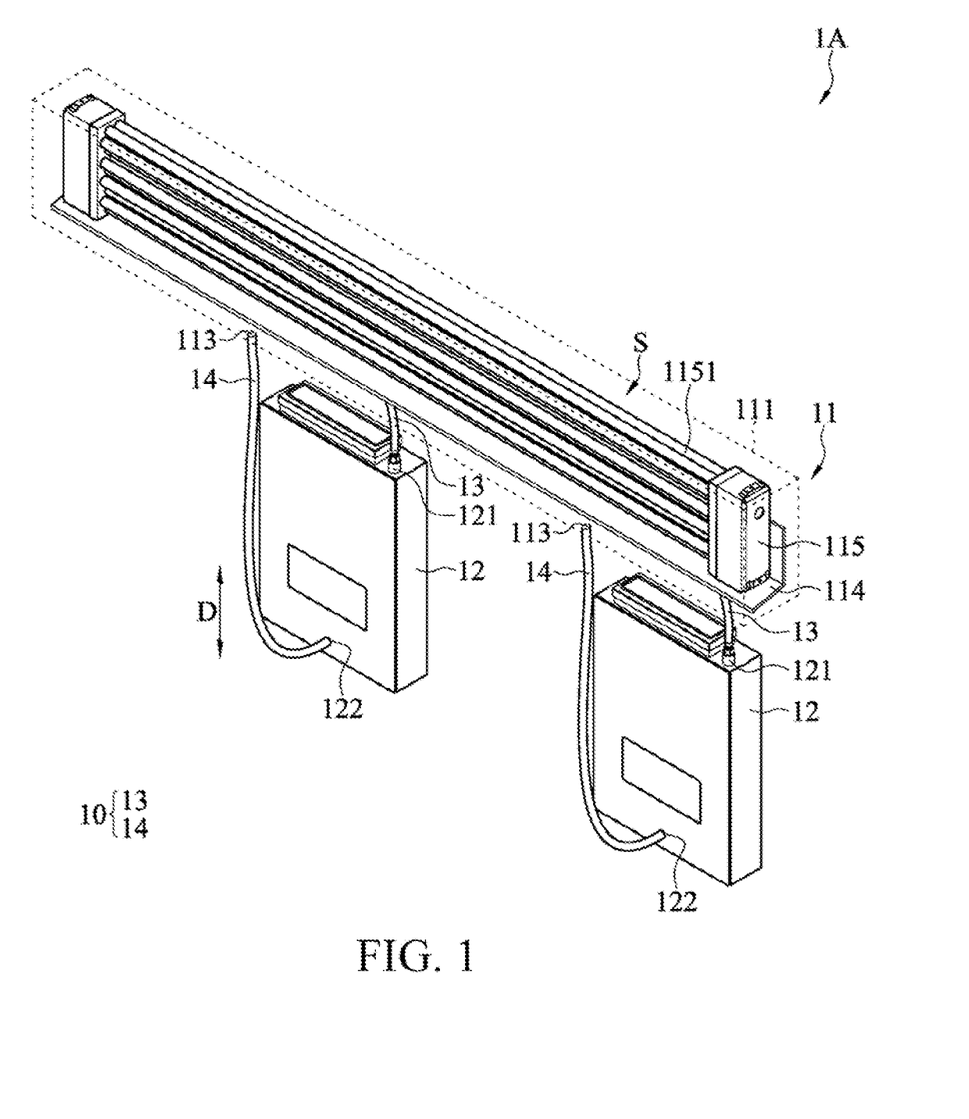
FIG. 1 illustrates a three-dimensional diagram of a separate immersion cooling device according to some embodiments.
Figure 2:
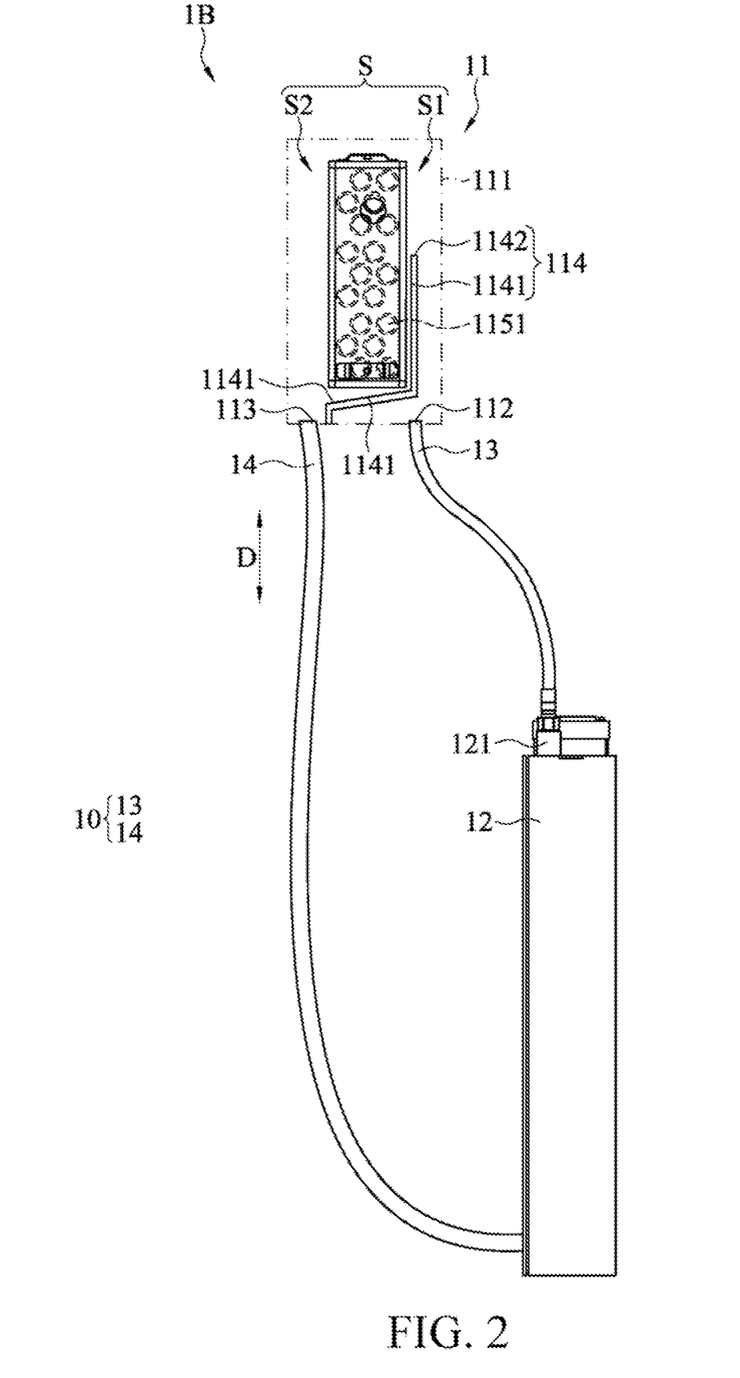
FIG. 2 illustrates a side view of a separate immersion cooling device according to some embodiments.

Referring to FIG. 1 and FIG. 2, FIG. 1 illustrates a three-dimensional diagram of a separate immersion cooling device 1A according to some embodiments. FIG. 2 illustrates a side view of a separate immersion cooling device 1B according to some embodiments. The separate immersion cooling device 1A, 1B includes a condensing device 11, a plurality of cooling tanks 12, and a pipeline assembly 10.

The condensing device 11 includes a condenser 115, located inside the condensing device 11. The cooling tanks 12 are separably connected to the condensing device 11. Each cooling tank 12 includes an outflow port 121 and a return port 122, and the outflow port 121 is located higher than the return port 122. The term "higher than" means that in a vertical direction D, a position of the outflow port 121 is higher than a position of the return port 122. The pipeline assembly 10 separately communicates the outflow ports 121 to the condensing device 11, and separately communicates the return ports to the condensing device 11.

According to the embodiment shown in FIG. 1, the condensing device 11 includes a case body 111, a plurality of condensation inlets 112, a plurality of condensation outlets 113, a partition plate 114, and the condenser 115. The condensation inlets 112 and the condensation outlets 113 are located on two sides below the case body 111. The case body 111 is provided with an accommodating space S. The partition plate 114 is located between the condensation inlets 112 and the condensation outlets 113, and partition the accommodating space S into a vapor space S1 and a condensing space S2. The condensation inlets 112 communicate with the vapor space S1, and the condensation outlets 113 communicate with the condensing space S2. The vapor space S1 communicates with the condensing space S2, and the condenser 115 is located in the condensing space S2. The condenser 115 includes a plurality of cooling pipes 1151. In some embodiments, the cooling pipes 1151 are copper pipes. In some embodiments, the condenser 115 is a water-cooled condenser 115. In other embodiments, the condenser 115 is an air-cooled condenser 115. All of these embodiments may be used for providing a condensation capability of condensing hot vapor into a liquid. However, the type of the condenser 115 is not limited in this disclosure.

According to the embodiment shown in FIG. 1, two cooling tanks 12 are provided. In some embodiments, more than two cooling tanks 12 are provided. The pipeline assembly 10 includes a plurality of outflow pipes 13 and a plurality of return pipes 14, and the outflow pipes 13 separately communicate the outflow ports 121 to the condensation inlets 112. The return pipes 14 separately communicate the return ports 122 to the condensation outlets 113. According to the embodiment shown in FIG. 1, a quantity of the outflow ports 121 is the same as a quantity of the condensation inlets 112, and a quantity of the return ports 122 is the same as a quantity of the condensation outlets 113. Each outflow port 121 communicates with one condensation inlet 112 by one outflow pipe 13. Each return port 122 communicates with one condensation outlet 113 by one return pipe 14. In some embodiments, the cooling tank 12 is provided with a working fluid and a heat-generating device. The heat-generating device is, for example, a server. The server is immersed in the working fluid which is in a liquid state. The position of the outflow port 121 in the vertical direction D is higher than a liquid level of the working fluid, and the position of the return port 122 may be lower or higher than the liquid level of the working fluid. After thermal energy generated by the server is absorbed by the working fluid, hot vapor is generated and enters the vapor space S1 of the cooling device through the outflow port 121, the outflow pipe 13, and the condensation inlet 112, so that a condensation step (described in detail later) is performed.

As shown in FIG. 2, the vapor space S1 communicates with the condensing space S2, and a communication portion of the two is an upper portion in the accommodating space S along the vertical direction D. In this way, the hot vapor flows upward in the vapor space S1, and further reaches the condensing space S2 through the communication portion; after being condensed by the condenser 115, the hot vapor condenses into a condensate L and then flows downward. Subsequently, the condensate L flows back to each cooling tank 12 through the condensation outlet 113, the return pipe 14, and the return port 122, and a cycle of cooling the hot vapor into condensed water is completed.

The partition plate 114 of the separate immersion cooling device 1B includes a connecting edge 1141 and an unconnected edge 1142. The unconnected edge 1142 is located at a communication portion of the vapor space S1 and the condensing space S2. The connecting edge 1141 is connected to the case body 111 and is located between the condensation inlet 112 and the condensation outlet 113. That is, the plurality of condensation inlets 112 and the plurality of condensation outlets 113 are located on two sides of the connecting edge 1141. One or more connecting edges 1141 may be provided. According to the embodiments shown in FIG. 1 and FIG. 2, the connecting edge 1141 includes a connecting portion between the partition plate 114 and the bottom of the case body 111 and a connecting portion between the partition plate 114 and an inner wall surface of the case body 111. One or more unconnected edges 1142 may be provided, which indicate disconnection from the case body 111. By means of the structure of the partition plate 114, the accommodating space S can be partitioned into the vapor space S1 and the condensing space S2. Because the connecting edge 1141 of the partition plate 114 is connected between the condensation inlets 112 and the condensation outlets 113, the hot vapor can be effectively isolated from the condensate L.

Figure 3:
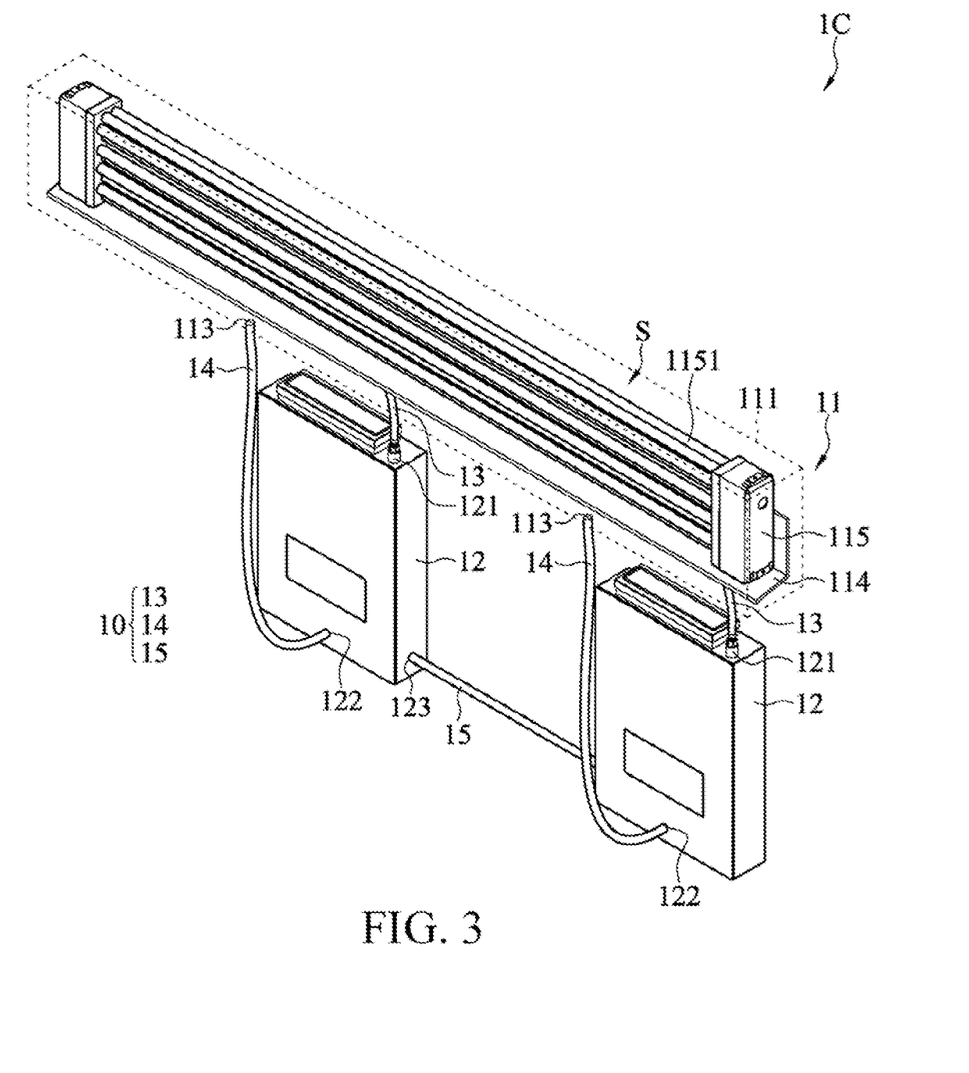
FIG. 3 illustrates a three-dimensional diagram of a separate immersion cooling device according to some embodiments.

FIG. 3 illustrates a three-dimensional diagram of a separate immersion cooling device 1C according to some embodiments. Each cooling tank 12 of the separate immersion cooling device 1C is provided with a liquid adjusting hole 123, and a position of the liquid adjusting hole 123 in the cooling tank 12 corresponds to a position of a return port 122 in the same cooling tank 12. In some embodiments, the position of the liquid adjusting hole 123 in the vertical direction D is equal to the position of the return port 122. In other embodiments, the position of the liquid adjusting hole 123 in the vertical direction D is lower than the position of the return port 122. According to the embodiment shown in FIG. 3, the position of the liquid adjusting hole 123 is lower than the position of the return port 122. The cooling tanks 12 communicate with each other by the liquid adjusting holes 123. According to some embodiments, the liquid adjusting holes 123 of two cooling tanks 12 can communicate with each other by using a liquid adjusting pipe 15. Based on the principle of communicating pipe, the amount of the working fluid in each cooling tank 12 is evenly distributed, to enable liquid levels of the working fluid in the cooling tanks 12 to be consistent with each other, so as to prevent the heat dissipation capacity of the cooling tanks 12 from being affected due to different amounts of the working fluid returned to the cooling tanks 12 after condensation in the cooling device.

Figure 4:
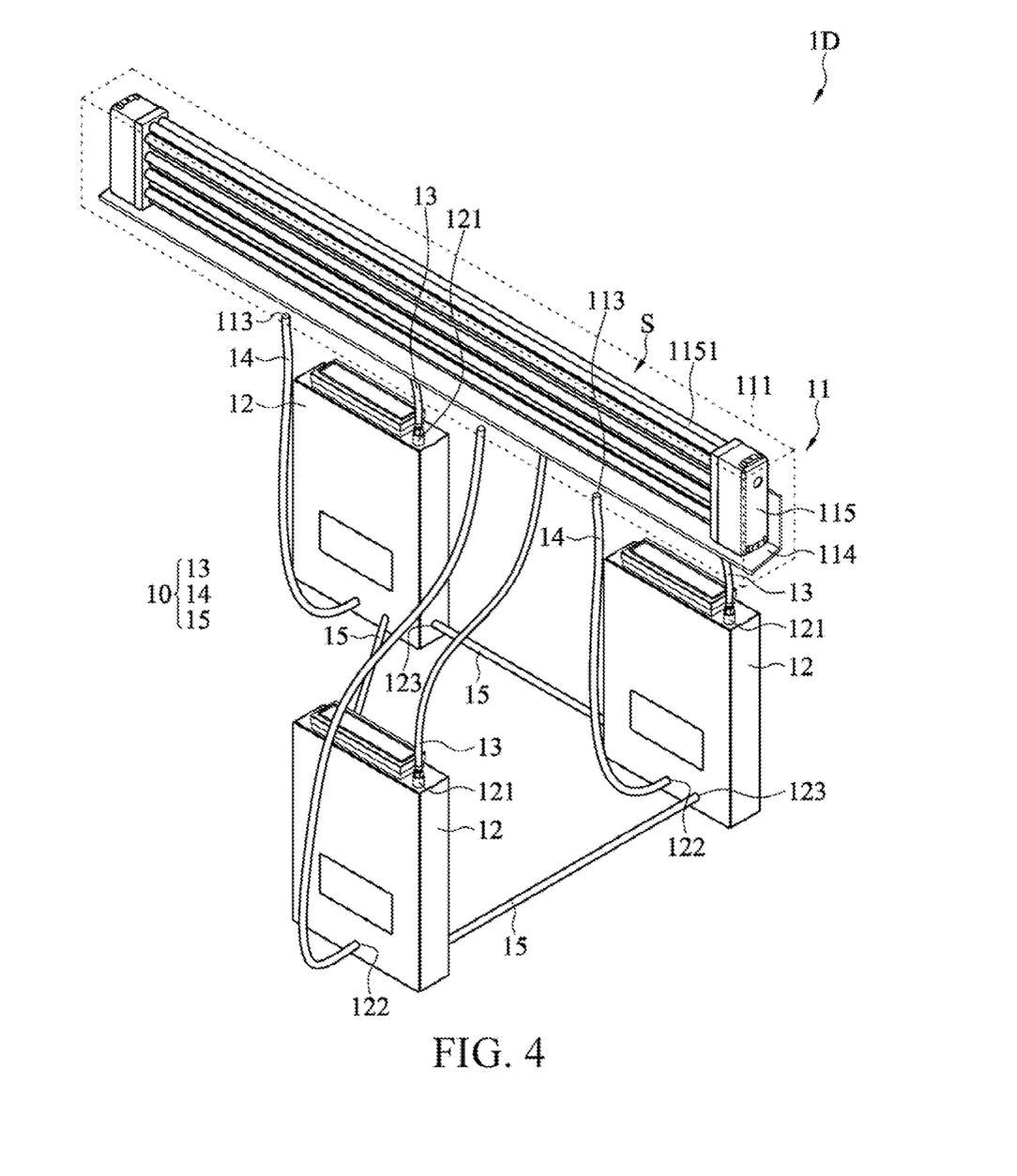
FIG. 4 illustrates a three-dimensional diagram of a separate immersion cooling device according to some embodiments.
Figure 5:
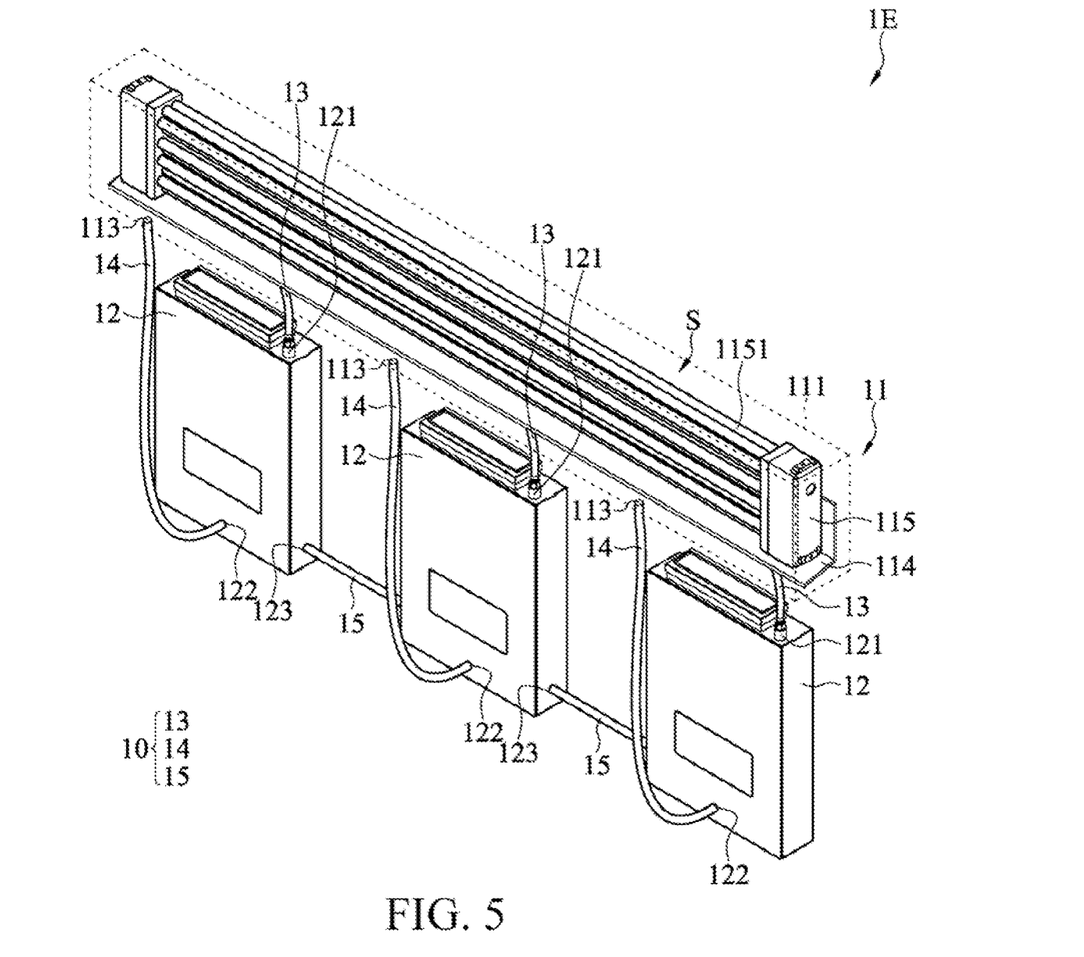
FIG. 5 illustrates a three-dimensional diagram of a separate immersion cooling device according to some embodiments.

FIG. 4 illustrates a three-dimensional diagram of a separate immersion cooling device 1D according to some embodiments, and FIG. 5 illustrates a three-dimensional diagram of a separate immersion cooling device 1E according to some embodiments. According to the embodiment shown in FIG. 4, a quantity of the liquid adjusting pipes 15 is equal to a quantity of the cooling tanks 12. According to the embodiment shown in FIG. 5, a quantity of the liquid adjusting pipes 15 is a quantity of the cooling tanks 12 minus one. In some embodiments, as shown in the embodiments of FIG. 4 and FIG. 5, some of the cooling tanks 12 each include two liquid adjusting holes 123.

Figure 6:
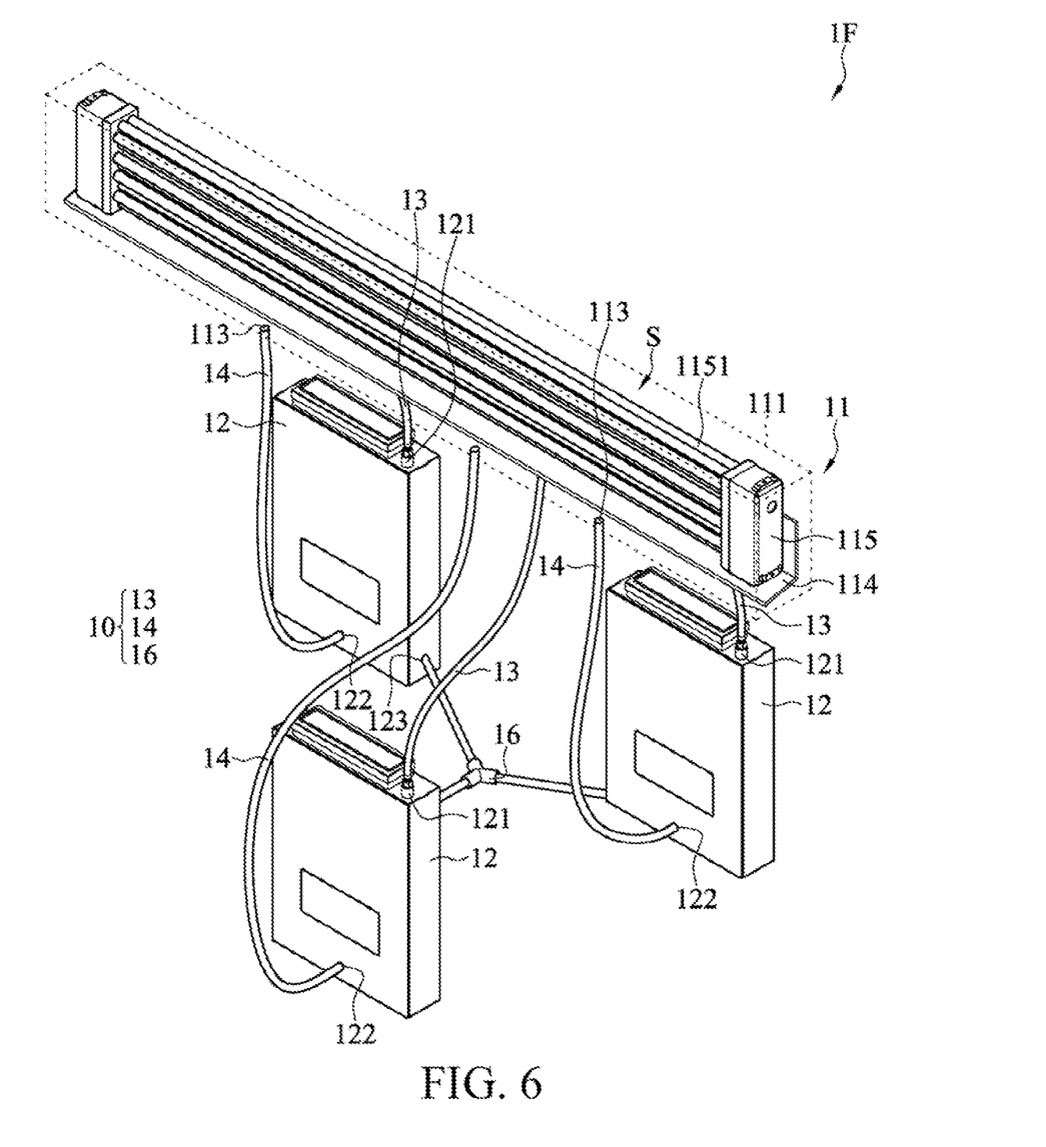
FIG. 6 illustrates a three-dimensional diagram of a separate immersion cooling device according to some embodiments.

FIG. 6 illustrates a three-dimensional diagram of a separate immersion cooling device 1F according to some embodiments. The pipeline assembly 10 includes a multi-way pipe 16, which communicates with the liquid adjusting holes 123 of the cooling tanks 12. The amount of the working fluid is evenly distributed by using the multi-way pipe 16, so that liquid levels of the working fluid in the cooling tanks 12 are consistent with each other. A plurality of pipes of the multi-way pipe 16 may be connected to the cooling tanks 12. According to the embodiment shown in FIG. 6, the multi-way pipe 16 includes three pipes. In some embodiments, the multi-way pipe 16 includes four pipes. The quantity of the pipes of the multi-way pipe 16 is determined according to a quantity and arrangement of the cooling tanks 12, and is not limited in this disclosure.

Figure 7:
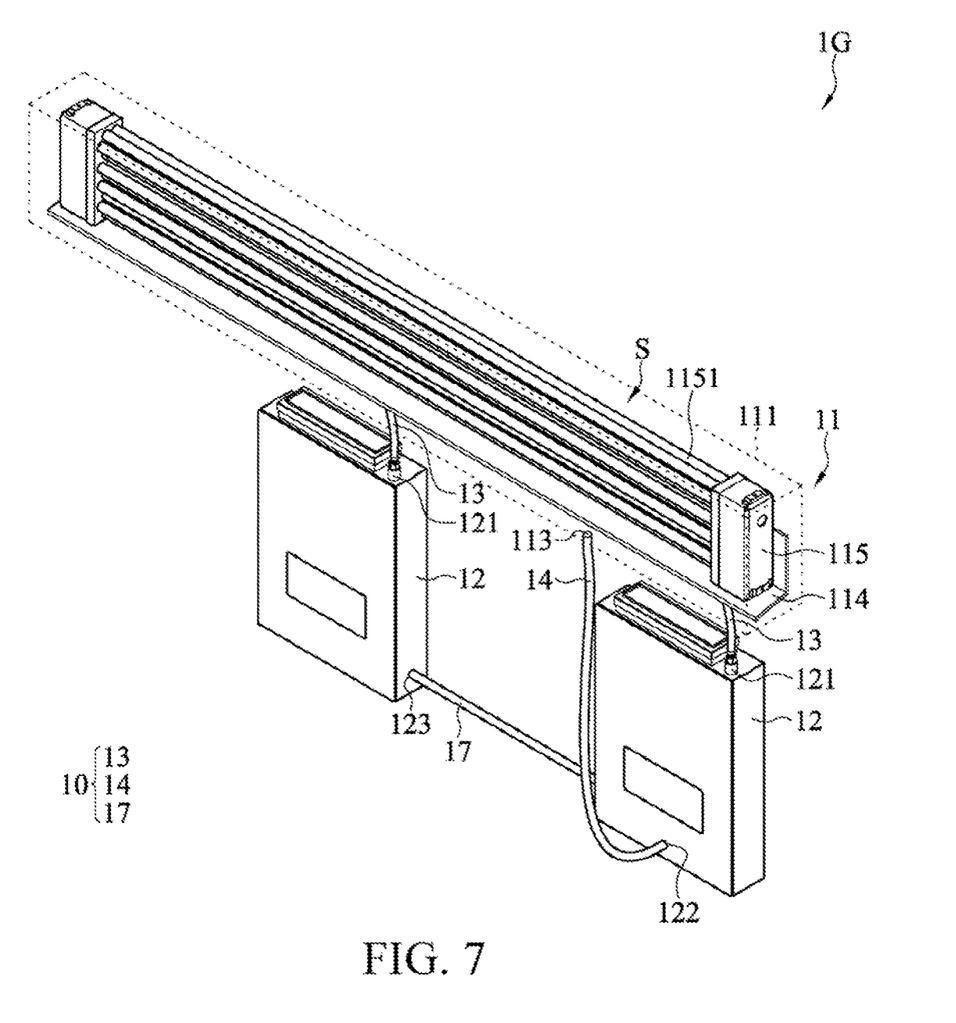
FIG. 7 illustrates a three-dimensional diagram of a separate immersion cooling device according to some embodiments.

FIG. 7 illustrates a three-dimensional diagram of a separate immersion cooling device 1G according to some embodiments. The separate immersion cooling device 1G includes a condensing device 11, a plurality of cooling tanks 12, and a pipeline assembly 10. The condensing device 11 includes a condenser 115, located inside the condensing device 11. The cooling tanks 12 are separately connected to the condensing device 11. Each cooling tank 12 includes an outflow port 121 and a liquid adjusting hole 123, and one of the plurality of cooling tanks includes a return port 122. The outflow port 121 is located higher than the return port 122. The pipeline assembly 10 separately communicates the outflow ports 121 to the condensing device 11, communicates the return port to the condensing device, and further communicates with the liquid adjusting holes 123 (described in detail later).

According to the embodiment shown in FIG. 7, the pipeline assembly 10 includes a plurality of outflow pipes 13, a return pipe 14, and a position adjusting pipe 17. The plurality of outflow pipes 13 separately communicate the outflow ports 121 to a condensation inlet 112, and the return port 122 is correspondingly connected to a condensation outlet 113 by the return pipe 14. The position adjusting pipe 17 communicates with the plurality of liquid adjusting holes 123, to balance the amount of working fluid in each cooling tank 12, so that liquid levels of the working fluid in the cooling tanks 12 are consistent with each other.

Figure 8:
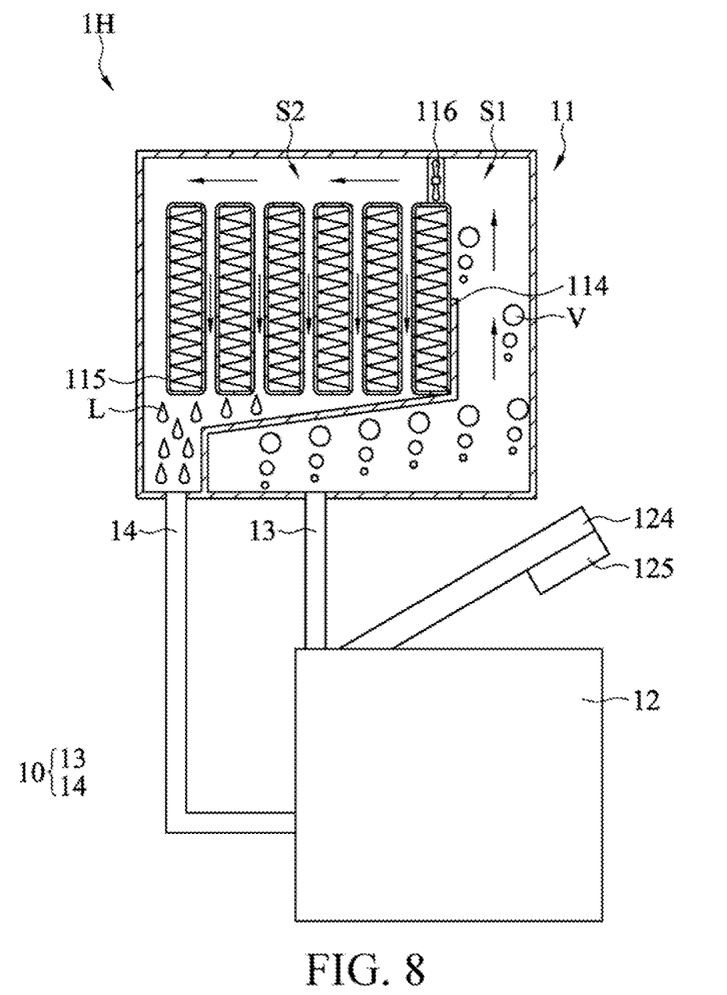
FIG. 8 illustrates a schematic diagram of a usage state of a separate immersion cooling device according to some embodiments.

FIG. 8 illustrates a schematic diagram of a usage state of a separate immersion cooling device 1H according to some embodiments. The cooling tank 12 contains a working fluid, and a plurality of heat-generating devices are immersed in the cooling tank 12 (not shown in the figure). Each cooling tank 12 further includes a cover 124 and a sensor 125. The sensor 125 is located in the cover 124 and can sense an action of the cover 124 to generate a starting signal. For example, the starting signal is generated when the cover 124 is lifted. The condensing device 11 further includes a fan 116, located at or near the communication portion of the vapor space S1 and the condensing space S2. When receiving one of the starting signals, the fan 116 pumps fluid in the vapor space S1 (for example, hot vapor V of the working fluid) toward the condensing space S2. In some embodiments, the sensor 125 is a magnetic reed switch. When the cover 124 of the cooling tank 12 is lifted, the magnetic reed switch transmits the starting signal to the fan 116, and the fan 116 starts a 100% extraction capacity to cause the hot vapor V in the cooling tank 12 to quickly enter the accommodating space S for condensation. The hot vapor V is condensed into a condensate L, to protect the user from the working fluid and to avoid the hot vapor V from escaping. According to some embodiments, each sensor 125 of the separate immersion cooling device does not generate the starting signal when the corresponding cover 124 is closed. One or more fans 116 may be provided, and a quantity of the fans 116 may be planned according to users' requirements and the size of the accommodating space S. According to some embodiments, one fan 116 is provided, the fan 116 still operates at 100% as long as the cover 124 of one of the plurality of cooling tanks 12 is in the open state. According to some embodiments, when a plurality of fans 116 are provided, all of the fans 116 operate at 100% as long as the cover 124 of the one of the plurality of cooling tanks 12 is in the open state. In addition, according to some embodiments, when a plurality of fans 116 are provided, one or more fans 116 corresponding to the cooling tank 12 with the cover 124 opened operates at 100%, and the term "corresponding" means, for example, a positional correspondence between the cooling tank 12 and the fan 116. According to some embodiments, the sensor 125 does not generate the starting signal when the covers 124 of all the cooling tanks 12 are closed. In this case, each fan 116 stops operating regardless of the quantity of the fans 116.

Figure 9:
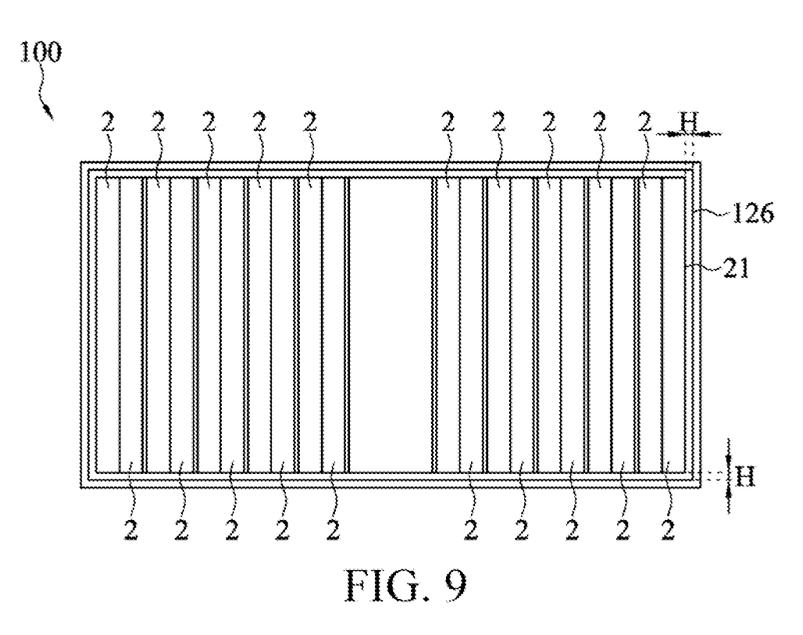
FIG. 9 illustrates a top view of a cooling tank in a separate immersion cooling system according to some embodiments, in which a condensing device, an outflow pipe, and a return pipe are omitted.

FIG. 9 illustrates a top view of a cooling tank 12 in a separate immersion cooling system 100 according to some embodiments. To illustrate a relationship between the cooling tank 12 and a server 2, FIG. 9 is simplified, and the condensing device 11, the outflow pipe 13, and the return pipe 14 are omitted. The separate immersion cooling system 100 includes a plurality of servers 2, the condensing device 11, a plurality of cooling tanks 12, and a pipeline assembly 10. For the condensing device 11, the cooling tank 12 and the pipeline assembly 10, refer to FIG. 1 to FIG. 8 and the foregoing related description. The condensing device 11 and the cooling tank 12 used by the separate immersion cooling system 100 may be any of the embodiments shown in FIG. 1 to FIG. 8, and are not limited in this disclosure.

As shown in FIG. 9, each cooling tank 12 contains a working fluid, and the cooling tanks 12 are respectively configured to accommodate some of the plurality of servers 2. A distance H between a wall surface 126 of the cooling tank 12 and a housing 21 of a corresponding server 2 (that is, the servers 2 placed in the cooling tank 12) is in a range of 1.5-2.0 mm. Because the condensing device 11 is disposed outside the cooling tank 12 (see FIG. 8), the user does not need to consider the size of the external cooling device. According to the embodiment shown in FIG. 9, for each cooling tank 12, an inner space of the cooling tank 12 can be effectively utilized for immersing a plurality of servers 2, and a volume space occupied by the cooling tank 12 is greatly reduced.

According to some embodiments, the user can utilize a suitable outflow pipe according to a power of the condenser, a power of the heat-generating device, a rate at which the working fluid generates hot vapor, or other factors, and the material, length and pipe diameter of the outflow pipe are not limited in this disclosure.

According to some embodiments, because the condensing device of the separate immersion cooling device is disposed outside the cooling tank, it is unnecessary to reserve a space for configuring the condensing device in the cooling tank. Therefore, an inner space of the cooling tank can be effectively utilized, and a plurality of heat-generating devices can be placed in a single cooling tank. According to some embodiments, the condenser in the condensing device is not limited to the inner space of the cooling tank, and a user can select a condenser with a large size and high condensing power to enhance condensing capacity. According to some embodiments, the plurality of cooling tanks of the separate immersion cooling device have a plurality of flexible combinations, which are not limited to the type and size of the condensing device, so as to save manufacturing costs. According to some embodiments, a manner of configuring the condensing device outside replaces the existing manner of configuring a plurality of condensing devices (or condensers) inside the cooling tank, which can save manufacturing costs.

According to some embodiments, the separate immersion cooling system includes the separate immersion cooling device adapted to cooling a plurality of servers. Because the condensing device is disposed outside of the cooling tank, it is unnecessary to reserve a space for configuring the condensing device in each cooling tank. Therefore, an inner space of the cooling tank can be effectively utilized, and a plurality of servers can be placed in a single cooling tank. According to some embodiments, the condenser in the condensing device is not limited to the inner space of the cooling tank, and a user can select a condenser with a large size and high condensing power to according to the power and quantity of the servers. According to some embodiments, the plurality of cooling tanks have a plurality of flexible combinations, which are not limited to the type and size of the condensing device. Therefore, the user can plan the cooling tanks to be used according to the size and quantity of servers, which can save manufacturing costs. In addition, according to some embodiments, a manner of configuring the condensing device of the separate immersion cooling system outside the cooling tank replaces the existing manner of configuring a plurality of condensing devices (or condensers) inside the cooling tank, which can save manufacturing costs.

What is claimed is:

1. A separate immersion cooling device, comprising:
   a condensing device, comprising a condenser, located inside the condensing device;
   a plurality of cooling tanks, separably connected to the condensing device, wherein each of the plurality of cooling tanks comprises an outflow port and a return port, and the outflow port is located higher than the return port; and
   a pipeline assembly, separately communicating the outflow ports to the condensing device, and separately communicating the return ports to the condensing device,
   wherein the condensing device comprises a case body, a plurality of condensation inlets, a plurality of condensation outlets, and a partition plate, the case body is provided with an accommodating space, the partition plate is located between the plurality of condensation inlets and the plurality of condensation outlets to partition the accommodating space into a vapor space and a condensing space, the plurality of condensation inlets communicate with the vapor space, the plurality of condensation outlets communicate with the condensing space, the vapor space communicates with the condensing space, and the condenser is located in the condensing space.

2. The separate immersion cooling device according to claim 1, wherein the partition plate comprises a connecting edge and an unconnected edge, the unconnected edge is located at a communication portion of the vapor space and the condensing space, and the connecting edge is connected to the case body and is located between the plurality of condensation inlets and the plurality of condensation outlets.

3. The separate immersion cooling device according to claim 1,
   wherein each of the plurality of cooling tanks is provided with a liquid adjusting hole, the plurality of cooling tanks communicate with each other by the liquid adjusting holes, a position of each liquid adjusting hole in the corresponding cooling tank corresponds to a position of the return port of the plurality of cooling tank, the pipeline assembly comprises a plurality of liquid adjusting pipes, a quantity of the plurality liquid adjusting pipes is a quantity of the plurality of cooling tanks minus one, and each of the plurality of liquid adjusting pipes communicates with two of the plurality of cooling tanks.

4. The separate immersion cooling device according to claim 1, wherein each of the plurality of cooling tanks further comprises:
   a cover; and
   a sensor, located in the cover,
   wherein the sensor senses an action of the cover to generate a starting signal.

5. The separate immersion cooling device according to claim 4, wherein the condensing device further comprises a fan, located at a communication portion of the vapor space and the condensing space, and the fan is started by the starting signal and pumps fluid in the vapor space toward the condensing space.

6. The separate immersion cooling device according to claim 1, wherein the pipeline assembly comprises a plurality of liquid adjusting pipes, and a quantity of the plurality of liquid adjusting pipes is a quantity of the plurality of cooling tanks minus one; each of the plurality of cooling tanks is provided with a liquid adjusting hole, the plurality of cooling tanks communicate with each other by the liquid adjusting holes, a position of each liquid adjusting hole in the corresponding cooling tank corresponds to a position of the return port of the plurality of cooling tank, and each of the plurality of liquid adjusting pipes communicates with two of the plurality of cooling tanks;
   wherein each of the plurality of cooling tanks further comprises:
   a cover; and
   a sensor, located in the cover, wherein the sensor senses an action of the cover to generate a starting signal;
the condensing device further comprises a fan, located at a communication portion of the vapor space and the condensing space, and the fan, when receiving one of the starting signals, pumps fluid in the vapor space toward the condensing space; and
the partition plate comprises a connecting edge and an unconnected edge, the unconnected edge is located at the communication portion of the vapor space and the condensing space, and the connecting edge is connected to the case body and is located between the plurality of condensation inlets and the plurality of condensation outlets.

7. A separate immersion cooling system, comprising:
the separate immersion cooling device according to claim 1; and
a plurality of servers, wherein each of the plurality of cooling tanks is configured to accommodate some of the plurality of servers, and a distance between a wall surface of each of the plurality of cooling tanks and a housing of a corresponding server is in a range of 1.5-2.0 mm.

8. The separate immersion cooling system according to claim 7, wherein each of the plurality of cooling tanks further comprises:
a cover; and
a sensor, located in the cover,
wherein the sensor senses an action of the cover to generate a starting signal.

9. The separate immersion cooling system according to claim 8, wherein the condensing device further comprises a fan, located at a communication portion of the vapor space and the condensing space, and the fan is started by the starting signal and pumps fluid in the vapor space toward the condensing space.

10. The separate immersion cooling system according to claim 7, wherein the pipeline assembly comprises a plurality of liquid adjusting pipes, and a quantity of the plurality of liquid adjusting pipes is a quantity of the plurality of cooling tanks minus one; each of the plurality of cooling tanks comprises a liquid adjusting hole, the plurality of cooling tanks communicate with each other by the liquid adjusting holes, a position of each liquid adjusting hole in the corresponding cooling tank corresponds to a position of the return port of the plurality of cooling tank, and each of the plurality of liquid adjusting pipes communicates with two of the plurality of cooling tanks;
wherein each of the plurality of cooling tanks further comprises:
a cover; and
a sensor, located in the cover,
wherein the sensor senses an action of the cover to generate a starting signal;
the condensing device further comprises a fan, located at a communication portion of the vapor space and the condensing space, and the fan, when receiving one of the starting signals, pumps fluid in the vapor space toward the condensing space; and
the partition plate comprises a connecting edge and an unconnected edge, the unconnected edge is located at the communication portion of the vapor space and the condensing space, and the connecting edge is connected to the case body and is located between the plurality of condensation inlets and the plurality of condensation outlets.

11. A separate immersion cooling device, comprising:
a condensing device, comprising a condenser, located inside the condensing device;
a plurality of cooling tanks, separably connected to the condensing device, wherein each of the plurality of cooling tanks comprises an outflow port and a liquid adjusting hole, one of the plurality of cooling tanks comprises a return port, and the outflow port is located higher than the return port; and
a pipeline assembly, separately communicating the outflow ports to the condensing device, communicating the return port to the condensing device, and further communicating with the liquid adjusting holes,
wherein the condensing device comprises a case body, a plurality of condensation inlets, a condensation outlet, and a partition plate, the case body is provided with an accommodating space, the partition plate is located between the plurality of condensation inlets and the condensation outlet to partition the accommodating space into a vapor space and a condensing space, the plurality of condensation inlets communicate with the vapor space, the condensation outlet communicates with the condensing space, the vapor space communicates with the condensing space, and the condenser is located in the condensing space.

12. The separate immersion cooling device according to claim 11, wherein the partition plate comprises a plurality of connecting edges and an unconnected edge, the unconnected edge is located at a communication portion of the vapor space and the condensing space, the plurality of connecting edges are connected to the case body, and one of the plurality of connecting edges is located between the plurality of condensation inlets and the condensation outlet.

13. The separate immersion cooling device according to claim 11, wherein each of the plurality of cooling tanks further comprises:
a cover; and
a sensor, located in the cover,
wherein the sensor senses an action of the cover to generate a starting signal.

14. The separate immersion cooling device according to claim 13, wherein the condensing device further comprises a fan, located at a communication portion of the vapor space and the condensing space, and the fan is started by the starting signal and pumps fluid in the vapor space toward the condensing space.

15. The separate immersion cooling device according to claim 11, wherein
each of the plurality of cooling tanks further comprises:
a cover; and
a sensor, located in the cover,
wherein the sensor senses an action of the cover to generate a starting signal;
the condensing device further comprises a fan, located at a communication portion of the vapor space and the condensing space, and the fan is started by the starting signal and pumps fluid in the vapor space toward the condensing space; and
the partition plate comprises a plurality of connecting edges and an unconnected edge, the unconnected edge is located at the communication portion of the vapor space and the condensing space, the plurality of connecting edges are connected to the case body, and one of the plurality of connecting edges is located between the plurality of condensation inlets and the condensation outlet.

16. A separate immersion cooling system, comprising:
the separate immersion cooling device according to claim 11; and
a plurality of servers, wherein each of the plurality of cooling tanks is configured to accommodate some of the plurality of servers, and a distance between a wall surface of each of the plurality of cooling tanks and a housing of a corresponding server is in a range of 1.5-2.0 mm.

17. The separate immersion cooling system according to claim 16, wherein each of the plurality of cooling tanks further comprises:
a cover; and
a sensor, located in the cover,
wherein the sensor senses an action of the cover to generate a starting signal.

18. The separate immersion cooling system according to claim 17, wherein the condensing device further comprises a fan, located at a communication portion of the vapor space and the condensing space, and the fan, when receiving one of the starting signals, pumps fluid in the vapor space toward the condensing space.

19. The separate immersion cooling system according to claim 16,
wherein each of the plurality of cooling tanks further comprises:
a cover; and
a sensor, located in the cover,
wherein the sensor senses an action of the cover to generate a starting signal;
the condensing device further comprises a fan, located at a communication portion of the vapor space and the condensing space, and the fan, when receiving one of the starting signals, pumps fluid in the vapor space toward the condensing space; and
the partition plate comprises a plurality of connecting edges and an unconnected edge, the unconnected edge is located at the communication portion of the vapor space and the condensing space, the plurality of connecting edges are connected to the case body, and one of the plurality of connecting edges is located between the plurality of condensation inlets and the condensation outlet.

* * * * *